US008405715B2

(12) United States Patent
Hamada et al.

(10) Patent No.: US 8,405,715 B2
(45) Date of Patent: Mar. 26, 2013

(54) INSPECTION APPARATUS AND INSPECTION METHOD
(75) Inventors: Ryuji Hamada, Osaka (JP); Akira Kameda, Osaka (JP)
(73) Assignee: Panasonic Corporation, Osaka (JP)
( * ) Notice: Subject to any disclaimer, the term of this patent is extended or adjusted under 35 U.S.C. 154(b) by 449 days.
(21) Appl. No.: 12/679,955
(22) PCT Filed: Sep. 18, 2008
(86) PCT No.: PCT/JP2008/002570
§ 371 (c)(1), (2), (4) Date: Mar. 25, 2010
(87) PCT Pub. No.: WO2009/041003
PCT Pub. Date: Apr. 2, 2009
(65) Prior Publication Data
US 2010/0201805 A1    Aug. 12, 2010
(30) Foreign Application Priority Data Sep. 28, 2007 (JP) ................................. 2007-255363

(51) Int. Cl.
*H04N 7/18* (2006.01)
*H05K 13/04* (2006.01)
*H05K 13/08* (2006.01)
(52) U.S. Cl. ......................................... 348/92; 156/264
(58) Field of Classification Search .................... 29/832, 29/833, 834, 836, 739, 741, 743; 348/92, 348/E5.025, E7.085; 156/64, 351; 702/95
See application file for complete search history.

(56) References Cited

U.S. PATENT DOCUMENTS 5,680,698 A * 10/1997 Armington et al. ............. 29/833
5,854,745 A    12/1998 Muraoka et al.
(Continued)

FOREIGN PATENT DOCUMENTS
JP    07-273497    10/1995
JP    2000-276233    10/2000
(Continued)

OTHER PUBLICATIONS

International Search Report issued Dec. 2, 2008 in corresponding International (PCT) Application No. PCT/JP2008/002570.

*Primary Examiner* — Gims Philippe
*Assistant Examiner* — Reza Aghevli
(74) *Attorney, Agent, or Firm* — Wenderoth, Lind & Ponack, L.L.P.

(57) ABSTRACT

Aims to provide an inspection apparatus and an inspection method for detecting an amount of misalignment of a component mounted on a panel through an ACF. The inspection apparatus detects an amount of misalignment, from a predetermined mounting position, of a component mounted on a panel's top surface through an AFC, and includes: a visible light illuminator (304) which illuminates with visible light a panel recognition mark formed on the panel's top surface; an infrared light illuminator which is provided on a side of the component's bottom surface not adhered to the panel and illuminates with infrared light a component recognition mark formed on the component's top surface; a visible light camera (306) which is provided on a bottom surface side of the panel which is opposite to a side of the panel on which the component is mounted, and which captures an image of the panel recognition mark illuminated with the visible light; an infrared camera (307) which is provided on a side of a bottom surface of the component not adhered to the panel, and which captures an image of the component recognition mark illuminated with the infrared light; and an amount-of-misalignment calculation unit which calculates an amount of misalignment from a predetermined positional relationship between the panel recognition mark and the component recognition mark based on the captured images of the panel recognition mark and the component recognition mark.

2 Claims, 14 Drawing Sheets

U.S. PATENT DOCUMENTS

| | | | |
|---|---|---|---|
| 7,299,545 B2 * | 11/2007 | Yamauchi et al. | 29/833 |
| 7,918,953 B2 * | 4/2011 | Yamauchi et al. | 156/64 |
| 8,224,063 B2 * | 7/2012 | Kameda et al. | 382/151 |
| 2001/0013170 A1 * | 8/2001 | Gamel et al. | 29/834 |
| 2003/0046812 A1 * | 3/2003 | Terada et al. | 29/833 |
| 2003/0053056 A1 | 3/2003 | Ohazama | |
| 2004/0163242 A1 * | 8/2004 | Fukunaga | 29/833 |

FOREIGN PATENT DOCUMENTS

| | | | |
|---|---|---|---|
| JP | 2000-276233 A * | 10/2000 | |
| JP | 2003-086999 | 3/2003 | |
| JP | 2004-031868 | 1/2004 | |
| JP | 2004-031868 A * | 1/2004 | |
| JP | 2004-309422 A * | 4/2004 | |
| JP | 2004-146785 | 5/2004 | |
| JP | 2004-309422 | 11/2004 | |
| JP | 2006-040978 | 2/2006 | |

* cited by examiner

FIG. 7
(a) Component recognition mark
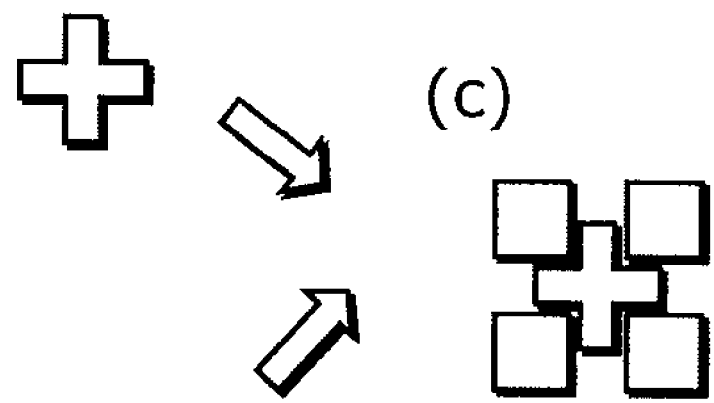
(c)
(b) Panel recognition mark
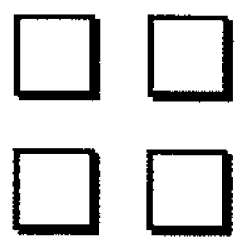

INSPECTION APPARATUS AND INSPECTION METHOD

This application claims priority benefit, under 35 U.S.C. 365, to International Application No.: PCT/JP2008/002570, filed on 18 Sep. 2008 which, in accordance with PCT Article 21(2), was published on 4 Feb. 2009 as WO/2009/041003 in English with the U.S. listed as a designated country. The PCT application, in turn, claims priority benefit, under 35 U.S.C. 119, to Japanese Patent Application No: 2007-255363 filed on 28 Sep. 2007.

TECHNICAL FIELD

The present invention relates to inspection apparatuses and inspection methods, and particularly to an inspection apparatus and an inspection method for inspecting a mounting status of an electronic component mounted on a substrate.

BACKGROUND ART

Conventionally, electronic components (hereinafter referred to as components), such as tape automated bonding (TAB) substrates, semiconductor elements, and flexible substrates which have an electrode, are mounted on flat panel displays (hereinafter referred to as panels) such as liquid crystal displays and plasma displays which have an electrode made of indium in oxide (ITO) and the like.

This mounting involves temporary and permanent compression-bonding of a component to a panel while providing an anisotropic conductive film (hereinafter referred to as an ACF) between the component and the panel, so as to bond the electrode of the panel (hereinafter referred to as a panel electrode) and the electrode of the component (hereinafter referred to as a component electrode). The temporary compression-bonding involves softly pressing the component using a thermocompression-bonding head, and the permanent compression-bonding following the temporary compression-bonding involves pressing the temporary compression-bonded component using a thermocompression-bonding head under a pressure and a temperature higher than in the temporal compression-bonding. Then, an amount of relative misalignment of the component from a predetermined mounting position is detected by an inspection apparatus. The detected amount of misalignment is provided as feedback for the next mounting of a component on the panel, and the mounting is performed in which the misalignment is corrected.

An example of such an inspection apparatus which detects the amount of component misalignment is one disclosed in Patent Reference 1. With this inspection apparatus, an amount of misalignment is detected by detecting an amount of misalignment of an alignment mark provided on a transparent substrate and an alignment mark provided on a component.

Patent Reference 1: Japanese Unexamined Patent Application Publication No. 2006-40978

SUMMARY OF THE INVENTION

Problems that Invention is to Solve

The inspection apparatus of Patent Reference 1 detects the position of the alignment mark of the component based on an image of the alignment mark captured by an imaging apparatus from the side of the transparent substrate's bottom surface (the surface of the transparent substrate on which the component is not mounted) while illuminating the alignment mark with near-infrared light from the transparent substrate's bottom surface side. Thus, this inspection apparatus cannot detect an amount of misalignment of a component mounted on a panel through an adhesive which contains conductive particles such as ACF. That is to say, since near-infrared light does not pass or does not easily pass through the conductive particles such as a metal, near-infrared light does not reach the alignment mark provided on the component even when the near-infrared light is emitted from the transparent substrate's bottom surface side. As a consequence, an image of the component alignment mark cannot be captured.

In view of the above problem, an object of the present invention is to provide an inspection apparatus and an inspection method for detecting an amount of misalignment of a component mounted on a panel through an adhesive which contains conductive particles.

Means to Solve the Problems

To achieve the above object, the inspection apparatus according to an aspect of the present invention is an inspection apparatus which detects an amount of misalignment, from a predetermined mounting position, of a component mounted on a top surface of a panel through an adhesive which contains conductive particles, the inspection apparatus including: a first inspection light illuminator which illuminates with first inspection light a panel recognition mark formed on the panel; a second inspection light illuminator which illuminates with second inspection light a component recognition mark formed on the component; a first camera which is provided on a bottom surface side of the panel which is opposite to a side of the panel on which the component is mounted, and which captures an image of the panel recognition mark illuminated with the first inspection light; a second camera which is provided on a side of a bottom surface of the component not adhered to the panel, and which captures an image of the component recognition mark illuminated with the second inspection light; and an amount-of-misalignment calculation unit configured to calculate an amount of misalignment from a predetermined positional relationship between the panel recognition mark and the component recognition mark based on the captured image of the panel recognition mark and the captured image of the component recognition mark.

Here, the first inspection light may have a wavelength which allows the first inspection light to pass through the panel but which does not allow or does not easily allow the first inspection light to pass through the conductive particles, and illuminate the panel recognition mark formed on the top surface of the panel, the top surface of the panel being a surface on which the component is mounted, and the second inspection light may have a wavelength which allows the second inspection light to pass through the component but which does not allow or does not easily allow the second inspection light to pass through the conductive particles, and illuminate the component recognition mark formed on a top surface of the component, the top surface of the component being a surface adhered to the panel.

This makes it possible to recognize the position of the component recognition mark by illuminating the component recognition mark with the second inspection light without passing through the conductive particles and to recognize the position of the panel recognition mark by illuminating the panel recognition mark with the first inspection light without passing through the conductive particles. That means the recognition of the positions of the panel recognition mark and the component recognition mark is free from the impact of the conductive particles, thereby allowing detection of the amount of misalignment of the component mounted on the panel through the adhesive containing the conductive particles such as the ACF.

Further, the first inspection light illuminator is a visible light illuminator, the second inspection light illuminator is an infrared light illuminator, the first camera is a visible light camera, and the second camera is an infrared camera.

This makes it possible to prevent increase in the size and complication of the apparatus because a special illuminator or a special camera are not necessary.

Moreover, the first camera and the second camera are preferably arranged on a same axis.

This makes it possible to detect the amount of misalignment without significantly correcting the captured images of the component recognition mark and the panel recognition mark.

The present invention can also be realized as an inspection method for detecting an amount of misalignment, from a predetermined mounting position, of a component mounted on a top surface of a panel through an adhesive which contains conductive particles, the inspection method including: illuminating with first inspection light a panel recognition mark formed on the panel; illuminating with second inspection light a component recognition mark formed on the component; capturing an image of the panel recognition mark illuminated with the first inspection light, from a bottom surface side of the panel which is opposite to a side of the panel on which the component is mounted; capturing an image of the component recognition mark illuminated with the second inspection light, from a side of a bottom surface of the component not adhered to the panel; and calculating an amount of misalignment from a predetermined positional relationship between the panel recognition mark and the component recognition mark based on the captured image of the panel recognition mark and the captured image of the component recognition mark.

Accordingly, it is possible to implement the inspection method for detecting the amount of misalignment of the component mounted on the panel through the adhesive containing the conductive particles such as the ACF.

EFFECTS OF THE INVENTION

The present invention provides an inspection apparatus and an inspection method for detecting an amount of misalignment of a component mounted on a panel through an adhesive which contains conductive particles.

BRIEF DESCRIPTION OF DRAWINGS

FIG. 7 The part (a) of FIG. 7 shows an example of a component recognition mark. The part (b) of FIG. 7 shows an example of a panel recognition mark. The part (c) of FIG. 7 shows an example of a component recognition mark and a panel recognition mark.

NUMERICAL REFERENCES

Figure 1:
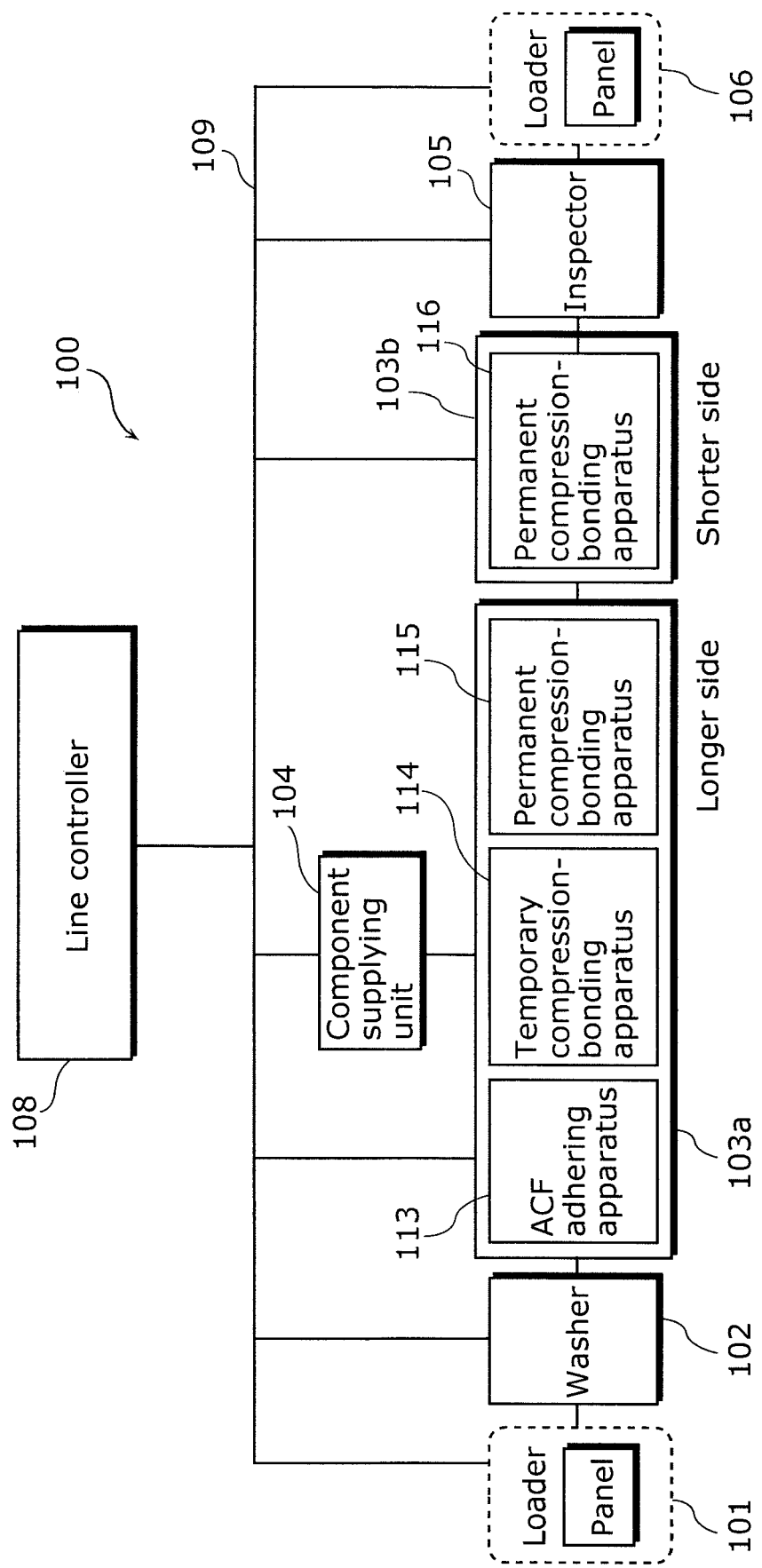
FIG. 1 is a conceptual diagram showing an entire configuration of a component mounting system according to an embodiment of the present invention.

100 Component mounting system
101, 106 Loader
102 Washer
103a, 103b Panel mounter
104 Component supplying unit
105 Inspector
108 Line controller
109 Communication cable
113 ACF adhering apparatus
114 Temporary compression-bonding apparatus
115, 116 Permanent compression-bonding apparatus
200 Panel
201 Component
202, 204, 206 Thermocompression-bonding head
203, 205, 207, 301 Back-up stage
210 ACF
300 Mounting-completed panel
302 Panel transfer stage unit
303 Under-panel transfer shaft unit
304 Visible light illuminator
305 Infrared light illuminator
306 Visible light camera
307 Infrared (IR) camera 410, 430, 440 Control unit
411, 431, 441 Storage unit
411a Master table
412, 432, 442 Input unit
413, 433, 443 Display unit
414, 434, 444 Communication I/F unit
415 Operation unit
431a Feedback data
435, 445 Mechanical unit
436 Data updating unit
441a Inspection position data
446 Amount-of-misalignment calculation unit
500, 600 Panel recognition mark
501, 601 Component recognition mark
502 Conductive particles

DETAIL DESCRIPTION OF THE INVENTION

Hereinafter, a component mounting system according to an embodiment of the present invention is described with reference to the drawings.

FIG. 1 is a conceptual diagram showing an entire configuration of a component mounting system 100 of the present embodiment.

The component mounting system 100 includes a line including: a loader 101; a washer 102; two panel mounters 103a and 103b; a component supplying unit 104; an inspector 105; and a loader 106, a line controller 108, and a communication cable 109.

The loader 101 supplies a panel to the line. The washer 102 washes a part of the panel supplied by the loader 101, where the ACF is to be adhered. The two panel mounters 103a and 103b mount and permanently compression-bond components on different sides of the panel. The component supplying unit 104 supplies a component to the panel mounter 103a. The inspector 105 detects an amount of relative misalignment of a component mounted on the top surface of the panel through the ACF, from a predetermined mounting position of the component. The loader 106 ejects the panel on which the components have been mounted (hereinafter referred to as a mounting-completed panel). The line controller 108 manages and controls communication and so on of various data and the operating status of the line as a whole. The communication cable 109 connects the line controller 108 with each element of the line.

The panel mounter 103a includes an ACF adhering apparatus 113, a temporary compression-bonding apparatus 114, and a permanent compression-bonding apparatus 115. The ACF adhering apparatus 113 applies an ACF to a longer side and a shorter side of the panel's top surface on which the components are to be mounted. The temporary compression-bonding apparatus 114 places a component using a thermocompression-bonding head, and softly presses the component to temporarily compression-bond the component to the panel's top surface. The permanent compression-bonding apparatus 115 presses the component, which has been temporarily compression-bonded to the longer side of the panel's top surface, using a thermocompression-bonding head under a pressure and a temperature higher than in the temporal compression-bonding, so as to permanently compression-bond the component to the panel's top surface.

The panel mounter 103b includes a permanent compression-bonding apparatus 116. The permanent compression-bonding apparatus 116 presses the component, which has been temporarily compression-bonded to the shorter side of the panel's top surface, using a thermocompression-bonding head under a pressure and a temperature higher than in the temporal compression-bonding, so as to permanently compression-bond the component to the panel's top surface.

Figure 2:
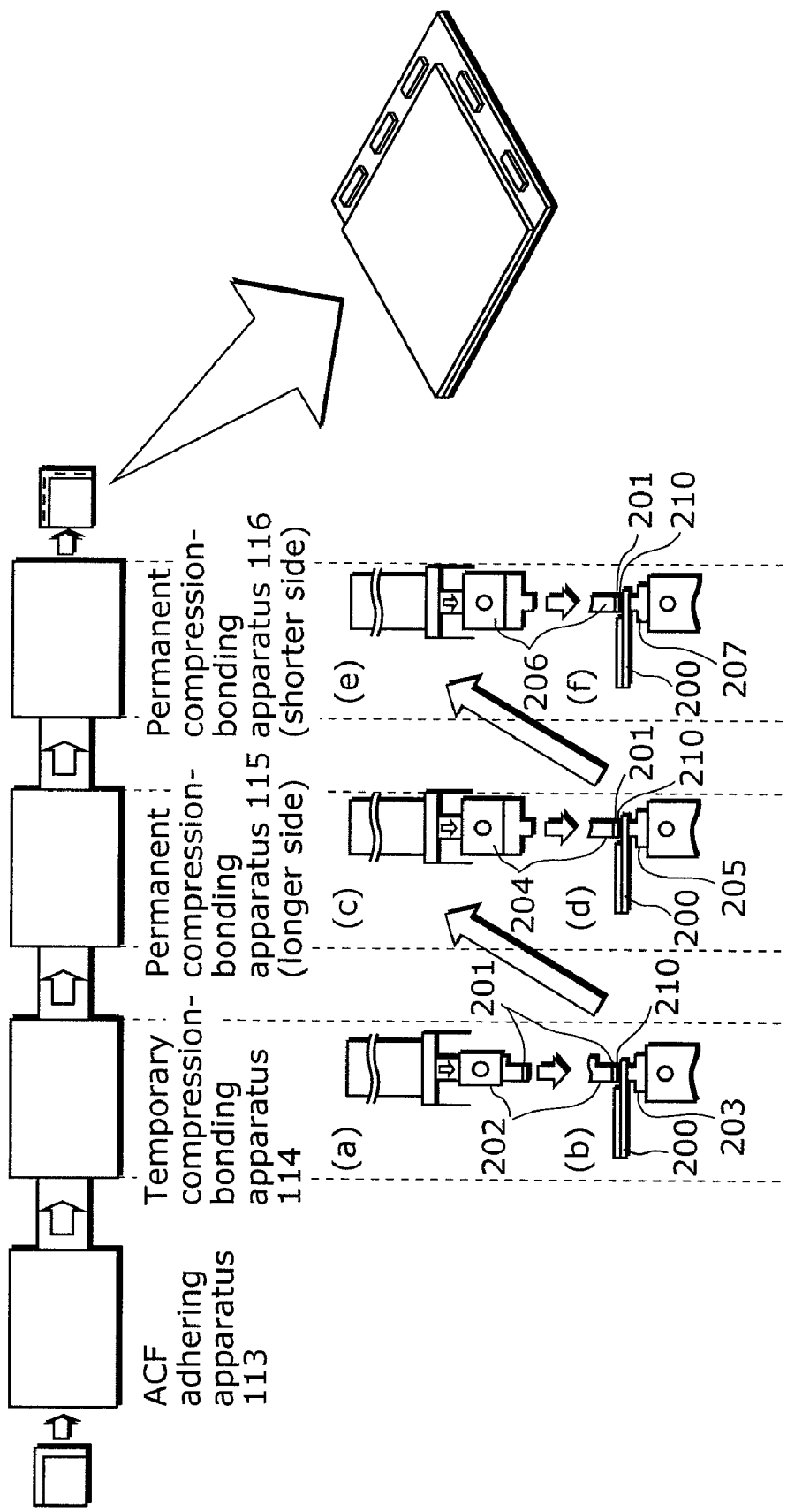
FIG. 2 shows how panel mounters of the component mounting system mount components on a panel.

FIG. 2 shows how the panel mounters 103a and 103b mount components on the panel.

First, the ACF adhering apparatus 113 applies an ACF 210 to a region, at the edges of the top surface of a panel 200, in which components are to be mounted, and then transfers the panel 200 to the temporary compression-bonding apparatus 114.

Next, the temporary compression-bonding apparatus 114 lowers a thermocompression-bonding head 202 holding a component 201 ((a) in FIG. 2), and temporarily compression-bonds the component 201 to the region of the top surface of the panel 200 placed on a back-up stage 203, to which the ACF 210 has been adhered ((b) in FIG. 2).

Next, after the panel 200 is transferred to the permanent compression-bonding apparatus 115, the permanent compression-bonding apparatus 115 lowers a thermocompression-bonding head 204 ((c) in FIG. 2) and permanently compression-bonds the component 201 which has been temporarily compression-bonded to the longer side of the top surface of the panel 200 placed on a back-up stage 205 ((d) in FIG. 2).

Lastly, after the panel 200 is transferred to the permanent compression-bonding apparatus 116, the permanent compression-bonding apparatus 116 lowers a thermocompression-bonding head 206 ((e) in FIG. 2) and permanently compression-bonds the component 201 which has been temporarily compression-bonded to the shorter side of the top surface of the panel 200 placed on a back-up stage 207 ((f) in FIG. 2).

Figure 3:
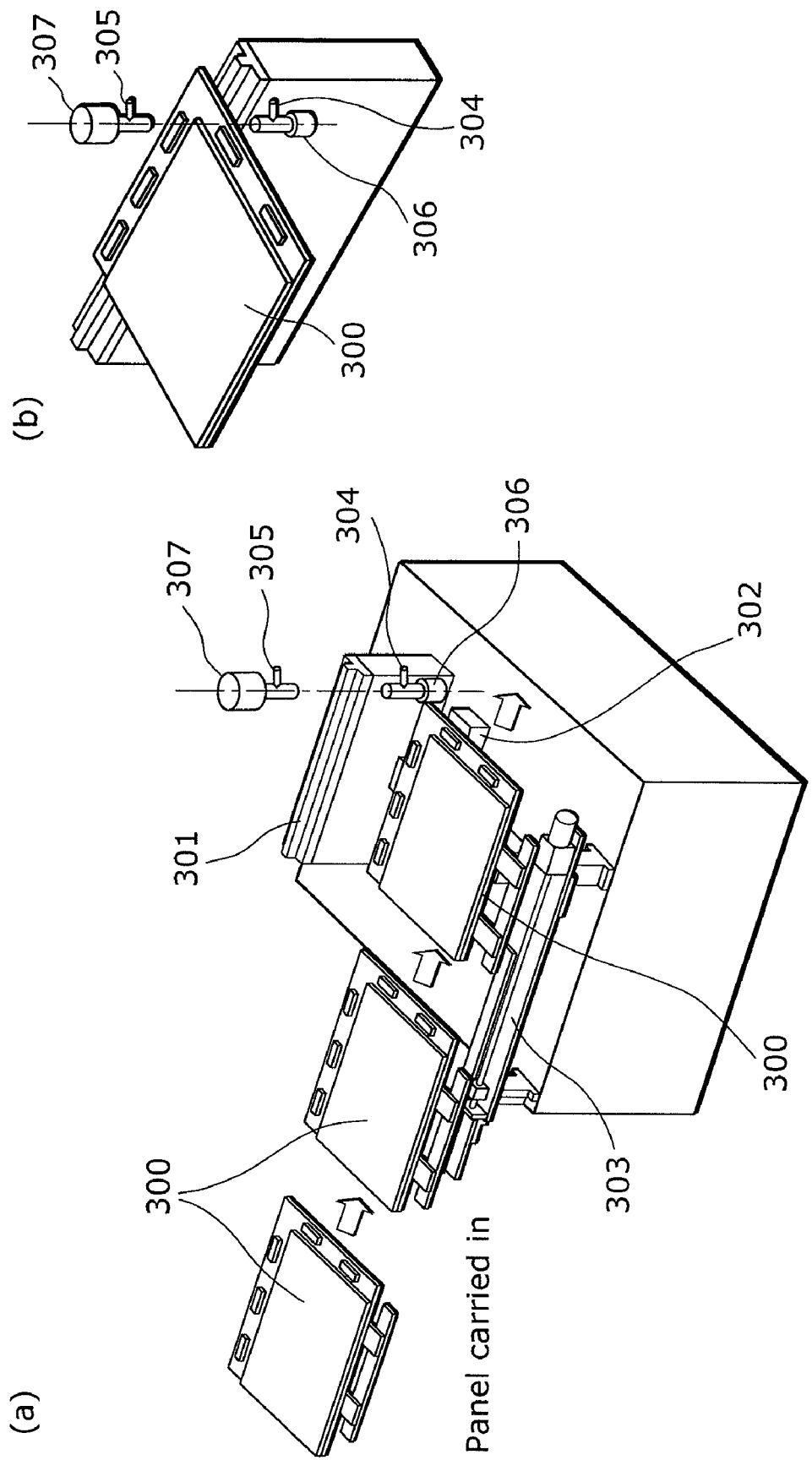
FIG. 3 The part (a) of FIG. 3 is a perspective view showing a schematic configuration of an inspector of the component mounting system. The part (b) of FIG. 3 shows how an inspector of the component mounting system inspects a mounting-completed panel.

The part (a) of FIG. 3 is a perspective view showing a schematic configuration of the inspector 105, and the part (b) of FIG. 3 shows how the inspector 105 inspects a mounting-completed panel 300.

The inspector 105 includes a back-up stage 301, a panel transfer stage unit 302, an under-panel transfer shaft unit 303, a visible light illuminator 304, an infrared light illuminator 305, a visible light camera 306, and an infrared (IR) camera 307.

It is to be noted that the visible light illuminator 304 is an example of the first inspection light illuminator of the present invention, and the infrared light illuminator 305 is an example of the second inspection light illuminator of the present invention. Further, the visible light camera 306 is an example of the first camera of the present invention, and the IR camera 307 is an example of the second camera of the present invention.

The mounting-completed panel 300 is placed on the back-up stage 301. The panel transfer stage unit 302 transfers the mounting-completed panel 300 to the back-up stage 301. The under-panel transfer shaft unit 303 transfers the mounting-completed panel 300 to the panel transfer stage unit 302.

The visible light illuminator 304 is provided on the side of the bottom surface of the mounting-completed panel 300 (the surface of the mounting-completed panel 300 on which the components are not mounted), and illuminates the bottom surface of the mounting-completed panel 300 with visible light. The mounting-completed panel 300 is transparent to the visible light, and thus the visible light from the visible light illuminator 304 passes through the mounting-completed panel 300 to illuminate a panel recognition mark formed on the top surface of the mounting-completed panel 300 (the surface of the mounting-completed panel 300 on which the components are mounted). Here, the panel is primarily made of glass, and the panel recognition mark is primarily made of Al.

The infrared light illuminator 305 is provided on the side of the component's bottom surface (the surface of the component not adhered to the panel), and illuminates the component's bottom surface with infrared light. The component is transparent to infrared light, and thus the infrared light emitted by the infrared light illuminator 305 passes through the component and illuminates the component recognition mark formed on the component's top surface (the surface of the component adhered to the panel). Here, the component is primarily made of polyimide and Si, and the component recognition mark is primarily made of Al.

The visible light camera 306 is provided on the bottom surface side of the mounting-completed panel 300. The visible light camera 306 captures an image of the panel recognition mark which is illuminated with visible light.

The IR camera 307 is provided on the side of the component's bottom surface which is opposite to the surface of the component adhered to the panel. The IR camera 307 captures an image of the component recognition mark which is illuminated with infrared light.

Figure 4:
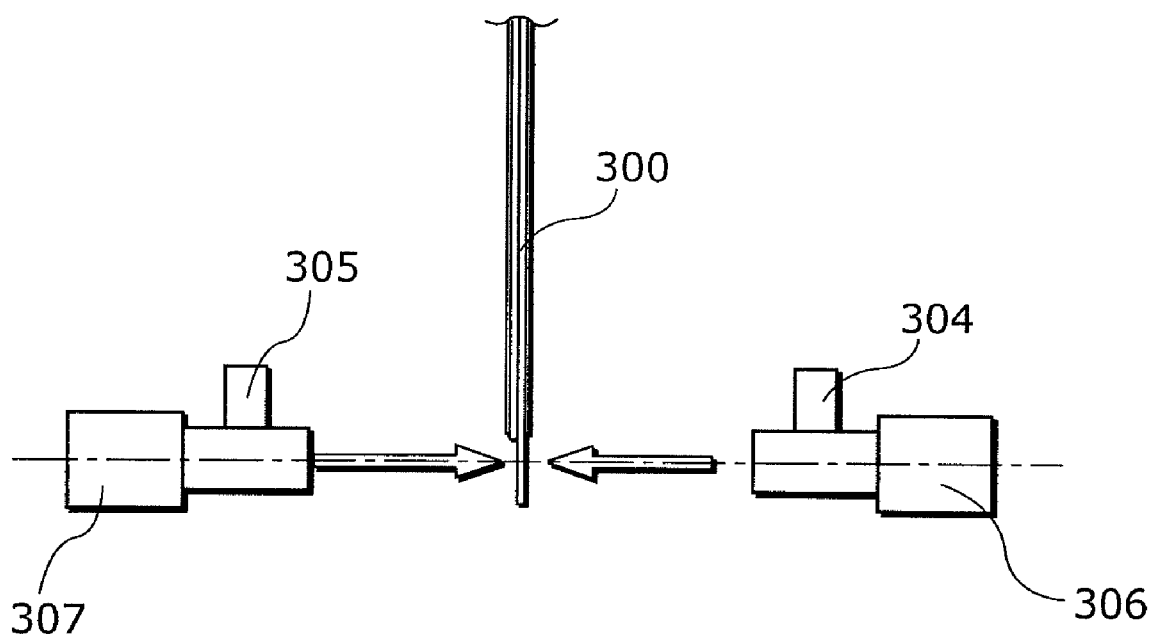
FIG. 4 shows a positional relationship between a visible light illuminator, an infrared light illuminator, a visible light camera, and an IR camera which are included in an inspector of the component mounting system.

As shown in FIG. 4, the visible light illuminator 304, the infrared light illuminator 305, the visible light camera 306, and the IR camera 307 are arranged on the same axis, and the visible light illuminator 304 and the visible light camera 306 are positioned opposite to the infrared light illuminator 305 and the IR camera 307 with the mounting-completed panel 300 therebetween. Here, being arranged on the same axis means that the orientation of the visible light illuminator 304 and the infrared light illuminator 305 (illuminating direction) and the orientation of the visible light camera 306 and the IR camera 307 (image capturing direction) are substantially on the same straight line.

Figure 5:
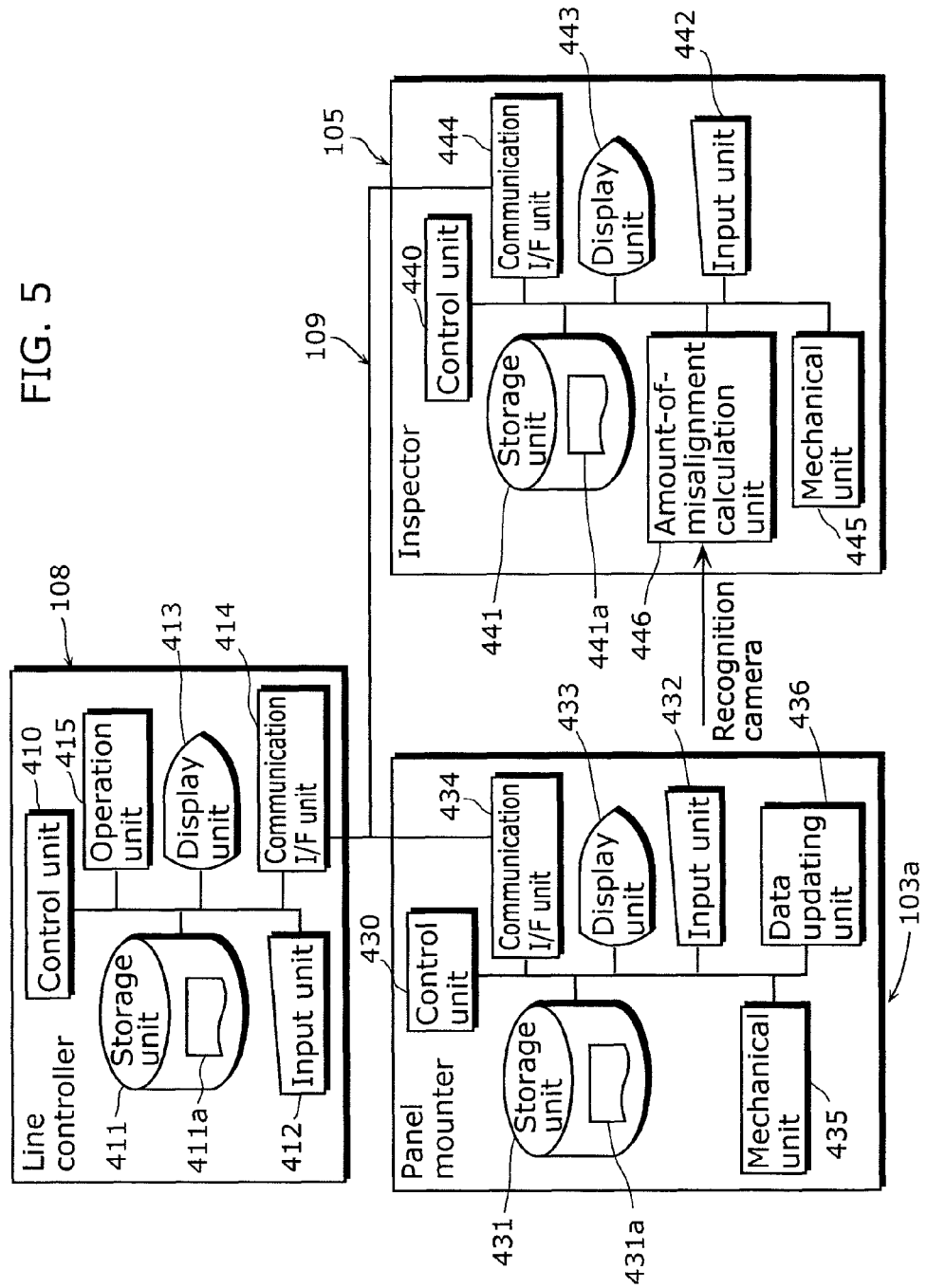
FIG. 5 is a functional block diagram showing a schematic configuration of the component mounting system.

FIG. 5 is a functional block diagram showing a schematic configuration of the component mounting system 100.

The line controller 108 includes a control unit 410, a storage unit 411, an input unit 412, a display unit 413, a communication I/F unit 414, and an operation unit 415.

According to an instruction or the like from an operator, the control unit 410 executes line control data stored in the storage unit 411, and controls each unit based on the execution result.

The storage unit 411 is a hard disk and a memory, for example, and holds line control data, a master table 411a, and so on. The master table 411a contains information indicating an associated pair of a mounting position and an amount of correction (feedback amount).

The input unit 412 is a keyboard and a mouse, for example, and the display unit 413 is a cathode-ray tube (CRT), a liquid crystal display (LCD), and the like. These units are used for communication and so on between the line controller 108 and the operator.

The communication I/F unit 414 is a local area network (LAN) adapter, for example, and is used for communication and so on between: the line controller 108; and the panel mounter 103a and the inspector 105.

The operation unit 415 calculates an amount of correction based on the amount of misalignment calculated by the inspector 105, and updates the master table 411a stored in the storage unit 411.

The panel mounter 103a includes a control unit 430, a storage unit 431, an input unit 432, a display unit 433, a communication I/F unit 434, a mechanical unit 435, and a data updating unit 436.

According to an instruction or the like from the operator, the control unit 430 executes NC data stored in the storage unit 431, and controls each unit based on the execution result.

The storage unit 431 is a hard disk and a memory, for example, and holds NC data, feedback data 431a, and so on. The feedback data 431a contains information indicating an associated pair of a mounting position and an amount of correction.

The input unit 432 is a keyboard and a mouse, for example, and the display unit 433 is a CRT, an LCD, and the like. These units are used for communication and so on between the panel mounter 103a and the operator.

The communication I/F unit 434 is a LAN adapter, for example, and is used for communication and so on between the panel mounter 103a and the line controller 108.

The mechanical unit 435 is a set of mechanical components including a thermocompression-bonding head, a transport unit, an arm, an XY table, a component supplying unit, a motor which drives these components, and a motor controller, for example.

The data updating unit 436 updates the feedback data 431a stored in the storage unit 431 based on the master table 411a transmitted by the line controller 108.

The inspector 105 includes a control unit 440, a storage unit 441, an input unit 442, a display unit 443, a communication I/F unit 444, a mechanical unit 445, and an amount-of-misalignment calculation unit 446.

The amount-of-misalignment calculation unit 446 is an example of the amount-of-misalignment calculation unit of the present invention.

According to an instruction or the like from the operator, the control unit 440 executes NC data stored in the storage unit 441, and controls each unit based on the execution result.

The storage unit 441 is a hard disk and a memory, for example, and holds NC data, inspection position data 441a, and so on. The inspection position data 441a is a set of information indicating all positions to be inspected by the inspector 105.

The input unit 442 is a keyboard and a mouse, for example, and the display unit 443 is a CRT, an LCD, and the like. These units are used for communication and so on between the inspector 105 and the operator.

The communication I/F unit 444 is a LAN adapter, for example, and is used for communication and so on between the inspector 105 and the line controller 108.

The mechanical unit 445 is a set of mechanical components including a panel transfer stage unit, an under-panel transfer shaft unit, a visible light illuminator, an infrared light illuminator, a visible light camera, an IR camera, a motor which drives these components, and a motor controller, for example.

The amount-of-misalignment calculation unit 446 recognizes a mounting position of the component and calculates an amount of misalignment from a predetermined mounting position based on image data captured by the visible light camera and the IR camera. More specifically, the amount-of-misalignment calculation unit 446 calculates an amount of misalignment from a predetermined positional relationship between the panel recognition mark and the component recognition mark based on the image of the panel recognition mark captured by the visible light camera and the image of the component recognition mark captured by the IR camera. Here, the amount of misalignment from the predetermined positional relationship means, for example, a distance between: a predetermined position of the component recognition mark determined using the panel recognition mark as a reference; and the actual position of the component recognition mark, or a distance between: a predetermined position of the panel recognition mark determined using the component recognition mark as a reference; and the actual position of the panel recognition mark. The predetermined positional relationship is derived from an image showing both the panel recognition mark and the component recognition mark, for example, and the image is stored in the storage unit 441.

Figure 6:
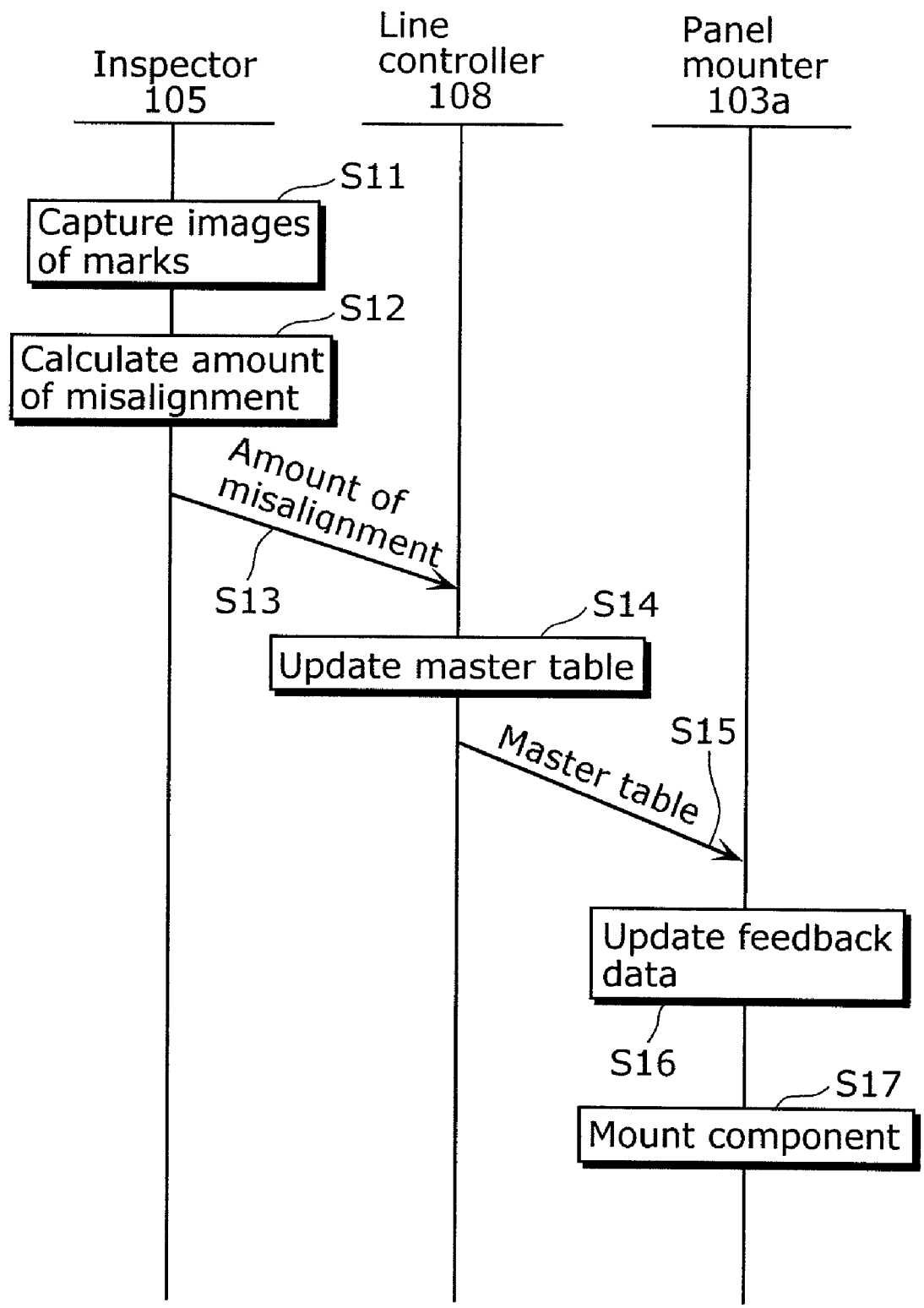
FIG. 6 shows a sequence of a feedback operation performed by the component mounting system.

Next, a feedback operation (providing feedback of an amount of component misalignment for the component mounting) performed by the component mounting system 100 is described in detail. FIG. 6 shows a sequence of the feedback operation performed by the component mounting system 100.

First, the control unit 440 of the inspector 105 causes the mechanical unit 445 to capture an image of a pair of the panel recognition mark of the mounting-completed panel 300 and the component recognition mark of the component (Step S11). To be more specific, the control unit 440 of the inspector 105 causes the visible light illuminator 304 to illuminate with visible light the panel recognition mark formed at one of the positions indicated in the inspection position data 441a, from the bottom surface side of the mounting-completed panel 300 which is opposite to the side of the mounting-completed panel 300 on which the component is mounted, and causes the visible light camera 306 to capture an image of the panel recognition mark from the bottom surface side of the mounting-completed panel 300. At the same time, the control unit 440 of the inspector 105 causes the infrared light illuminator 305 to illuminate with infrared light the component recognition mark of the component mounted at one of the positions indicated in the inspection position data 441a, from the side of the component's bottom surface which is opposite to the surface of the component adhered to the panel, and causes the IR camera 307 to capture an image of the panel recognition mark from the component's bottom surface side.

Next, the control unit 440 of the inspector 105 causes the amount-of-misalignment calculation unit 446 to calculate an amount of misalignment (Step S12). More specifically, the control unit 440 of the inspector 105 causes the amount-of-misalignment calculation unit 446 to calculate an amount of misalignment of the component mounted at one of the positions indicated in the inspection position data 441a from a predetermined mounting position (amount of misalignment from a predetermined positional relationship between the panel recognition mark and the component recognition mark) based on the image of the panel recognition mark captured by the visible light camera 306 and the image of the component recognition mark captured by the IR camera 307.

Figure 8:
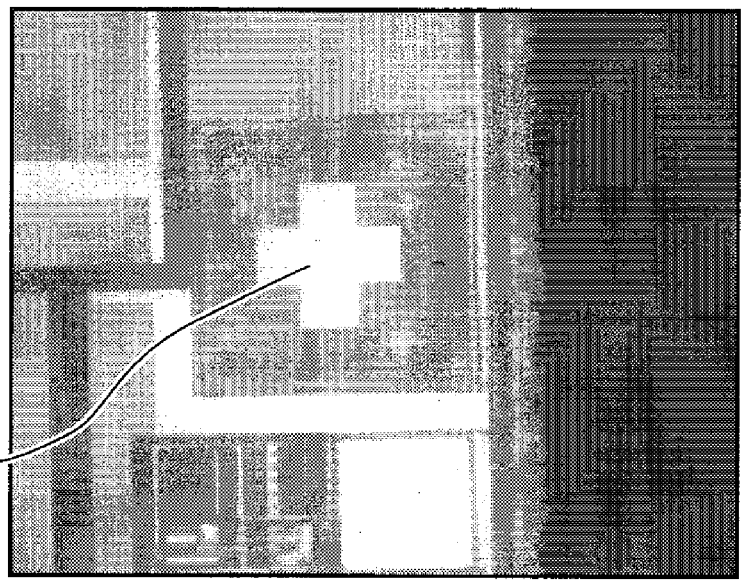
FIG. 8 shows an example of an image of a component recognition mark, which is obtained by an inspector of the component mounting system.
Figure 9:
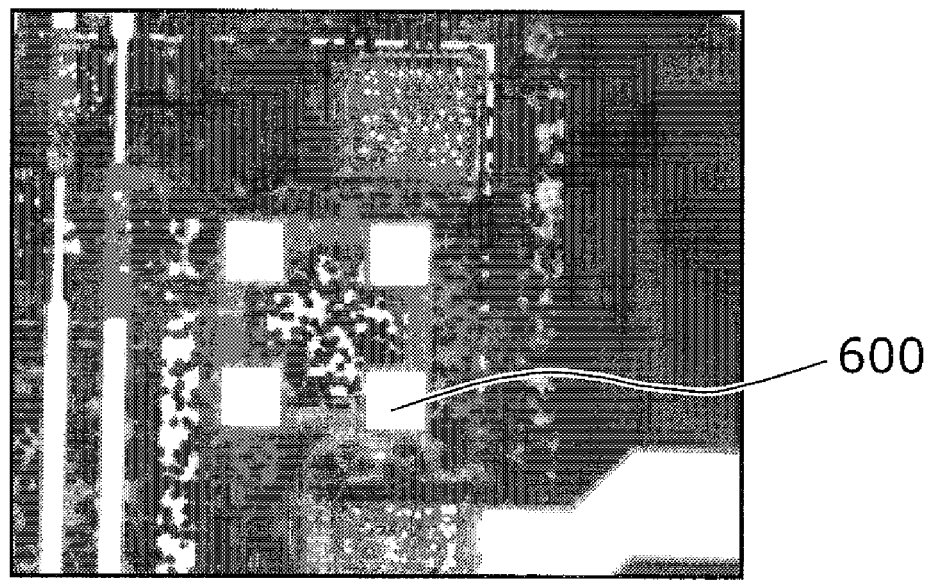
FIG. 9 shows an example of an image of a panel recognition mark, which is obtained by an inspector of the component mounting system.

For example, when a component recognition mark as shown in the part (a) of FIG. 7 is formed on the component and a panel recognition mark as shown in the part (b) of FIG. 7 is formed on the panel, the IR camera 307 captures an image of a component recognition mark 601 as shown in FIG. 8 and the visible light camera 306 captures an image of a panel recognition mark 600 as shown in FIG. 9. Then, these images are superimposed to calculate amounts of misalignment of both the recognition marks using a positional relationship shown in the part (c) of FIG. 7 as a reference.

Next, the control unit 440 of the inspector 105 causes the communication I/F unit 444 to transmit to the line controller 108 the calculated amount of misalignment in association with a mounting position indicated in the inspection position data 441a (Step S13).

Next, the control unit 410 of the line controller 108 causes the operation unit 415 to update the master table 411a stored in the storage unit 411 based on the amount of misalignment received via the communication I/F unit 414 (Step S14).

Next, the control unit 410 of the line controller 108 causes the communication I/F unit 444 to transmit the updated master table 411a to the panel mounter 103a (Step S15).

Next, the control unit 430 of the panel mounter 103a updates the feedback data 431a stored in the storage unit 431 based on the master table 411a received via the communication I/F unit 434 (Step S16).

Lastly, the control unit 430 of the panel mounter 103a executes NC data and causes the mechanical unit 435 to mount the component on the panel (Step S17). The mounting involves correcting the mounting position with the updated feedback data 431a taken into account, and mounting the component at the corrected mounting position.

Figure 10:
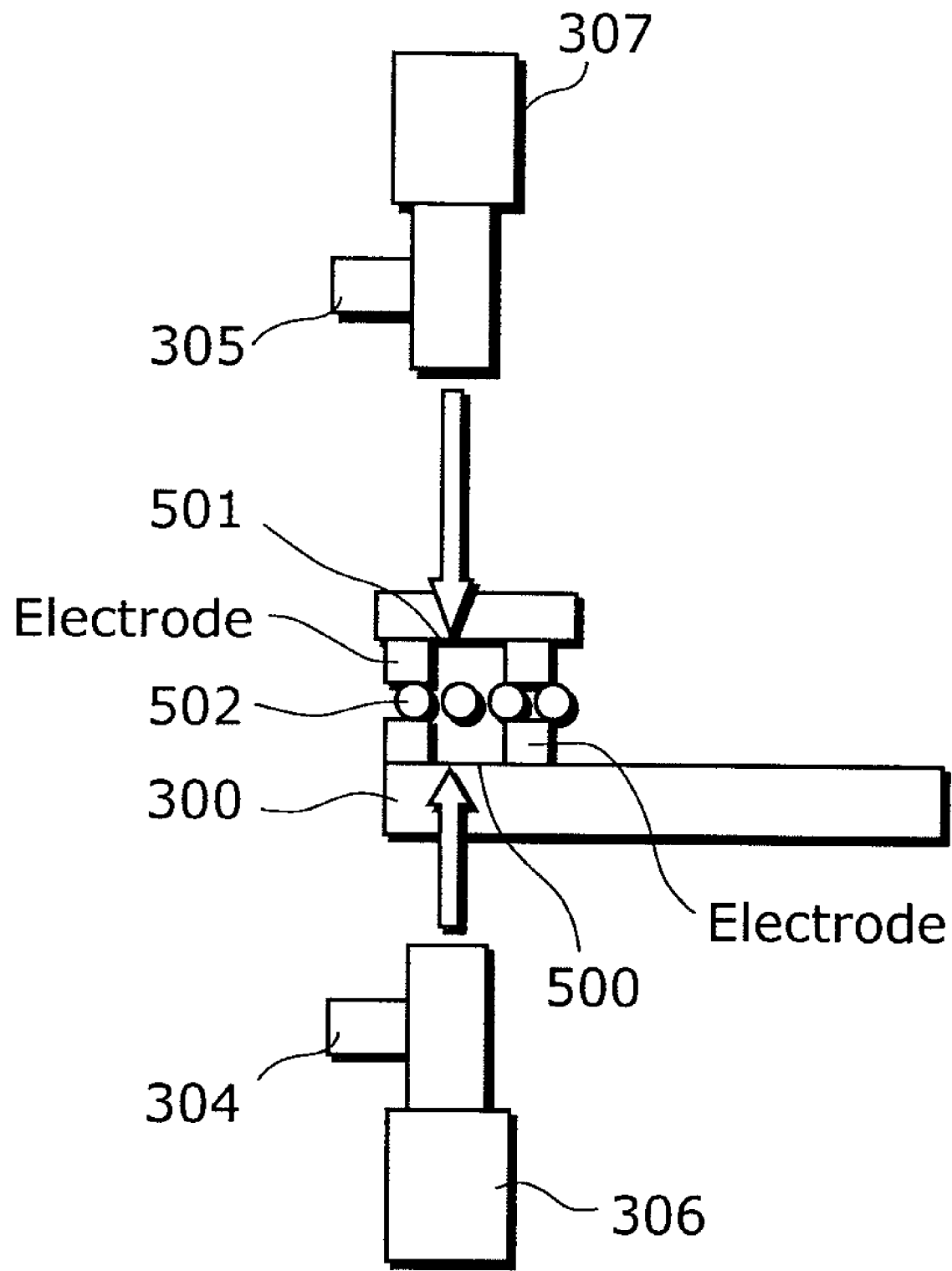
FIG. 10 shows how an inspector of the component mounting system recognizes a position of a component recognition mark and a position of a panel recognition mark.

As described above, as shown in FIG. 10, the inspector 105 according to the present embodiment illuminates with infrared light a component recognition mark 501 without passing through conductive particles 502 of the ACF 210 so as to recognize the position of the component recognition mark 501. Similarly, the inspector 105 according to the present embodiment illuminates with visible light a panel recognition mark 500 without passing through the conductive particles 502 so as to recognize the position of the panel recognition mark 500. Thus, the recognition of the positions of the panel recognition mark 500 and the component recognition mark 501 is free from the impact of the conductive particles 502, thereby making it possible to detect the amount of misalignment of the component mounted on the panel through the ACF 210.

Figure 11:
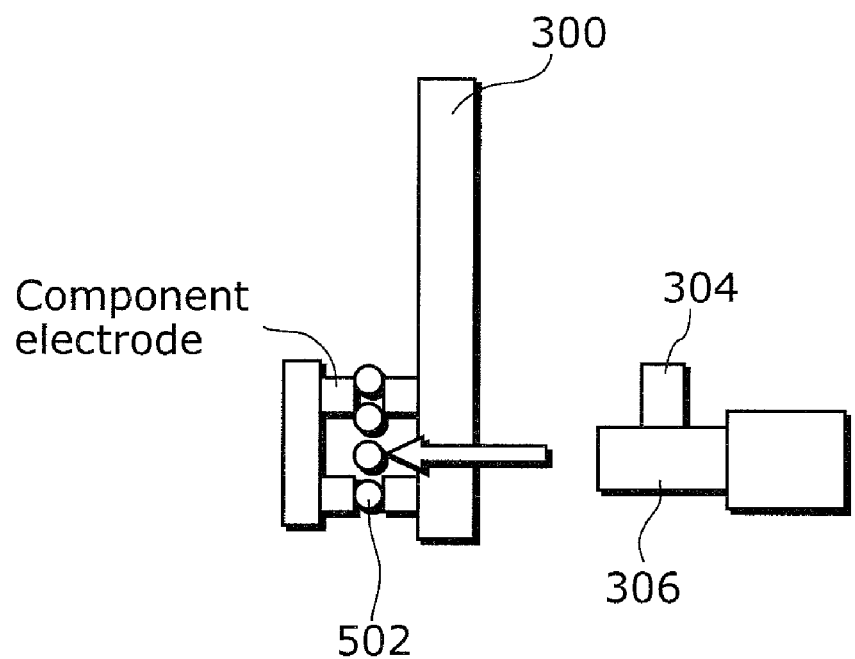
FIG. 11 shows how a position of a component recognition mark and a position of a panel recognition mark are recognized.
Figure 12:
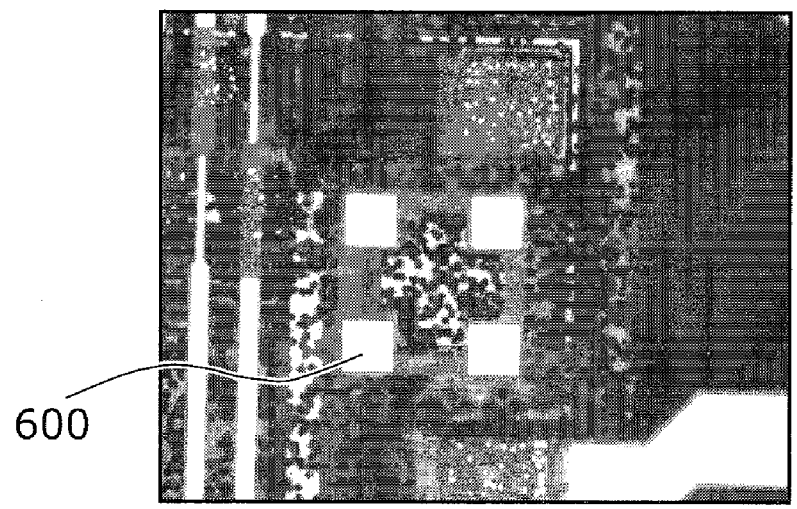
FIG. 12 shows a captured image of a panel recognition mark.

As shown in FIG. 11, in the case where the mounting-completed panel 300 is inspected with only the visible light camera 306 and the visible light illuminator 304 provided on the bottom surface side of the mounting-completed panel 300 which is opposite to the side of the mounting-completed panel 300 on which the component is mounted, it is possible to obtain a favorable image of the panel recognition mark 600 as shown in FIG. 12, that is, it is possible to obtain an image in which the outline of the panel recognition mark is clear and which allows detection of the amount of misalignment. However, a favorable image of the component recognition mark cannot be obtained because visible light cannot pass or does not easily pass through the conductive particles 502.

Figure 13:
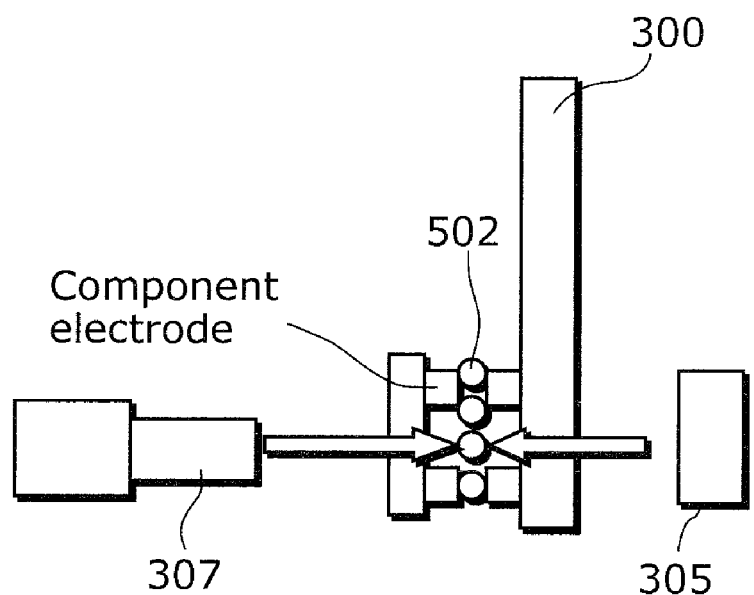
FIG. 13 shows how a position of a component recognition mark and a position of a panel recognition mark are recognized.
Figure 14:
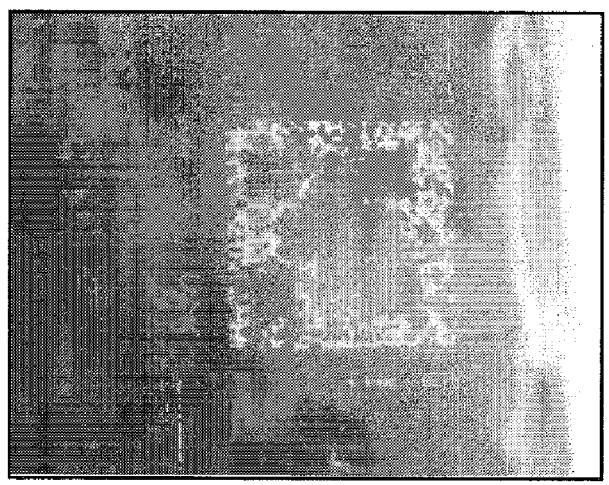
FIG. 14 shows a captured image of a component recognition mark or a panel recognition mark.

Further, as shown in FIG. 13, in the case where the mounting-completed panel 300 is inspected with only the IR camera 307 and the infrared light illuminator 305 provided, where the IR camera 307 being placed on the side of the component's bottom surface which is opposite to the surface of the component adhered to the panel and the infrared light illuminator 305 being placed on the bottom surface side of the mounting-completed panel 300 which is opposite to the side of the mounting-completed panel 300 on which the component is mounted, it is not possible to obtain a favorable image of the panel recognition mark nor of the component recognition mark because infrared light cannot pass or does not easily pass through the conductive particles 502. For example, as shown in FIG. 14, it is only possible to obtain an image of the panel recognition mark and the component recognition mark in which the outlines of the respective recognition marks are unclear and which does not allow detection of amounts of misalignment.

Figure 15:
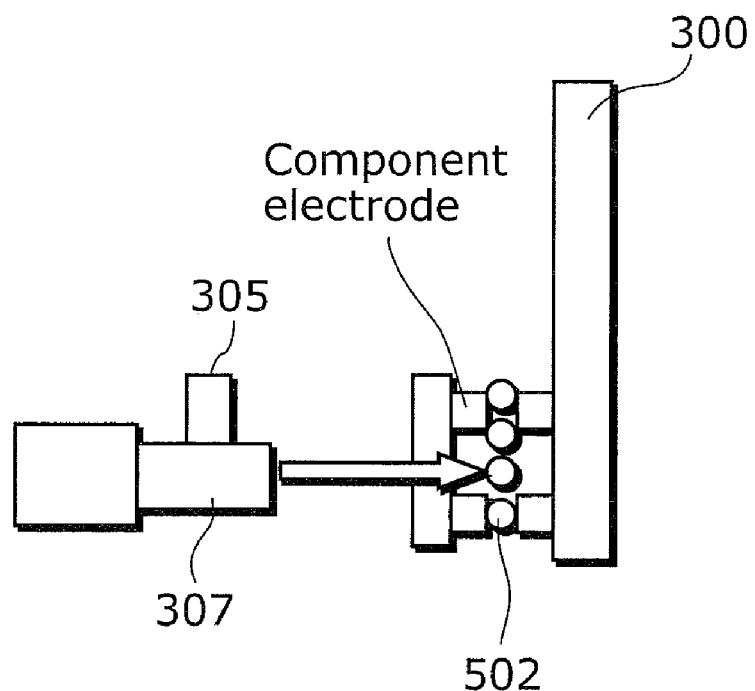
FIG. 15 shows how a position of a component recognition mark and a position of a panel recognition mark are recognized.
Figure 16:
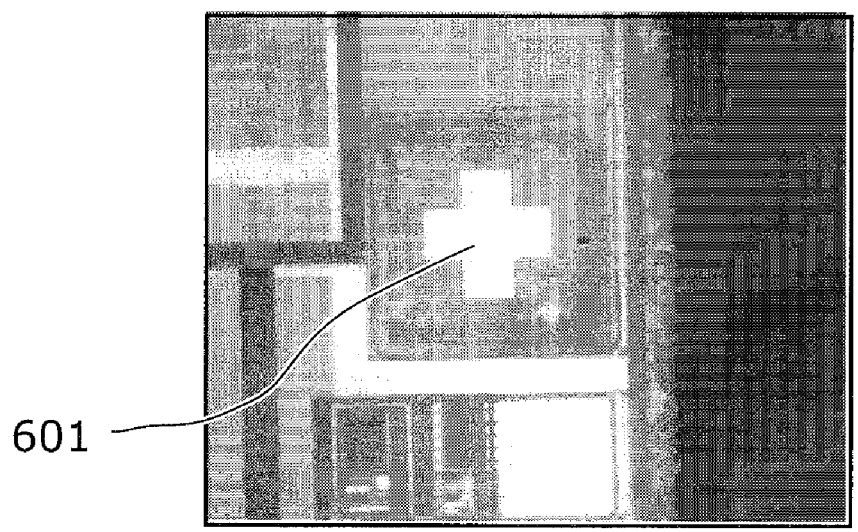
FIG. 16 shows a captured image of a component recognition mark.

Further, as shown in FIG. 15, in the case where the mounting-completed panel 300 is inspected with only the IR camera 307 and the infrared light illuminator 305 provided on the component's bottom surface side, it is possible to obtain a favorable image of the component recognition mark 601 as shown in FIG. 16. However, it is not possible to obtain a favorable image of the panel recognition mark because infrared light cannot pass or does not easily pass through the conductive particles 502.

Figure 17:
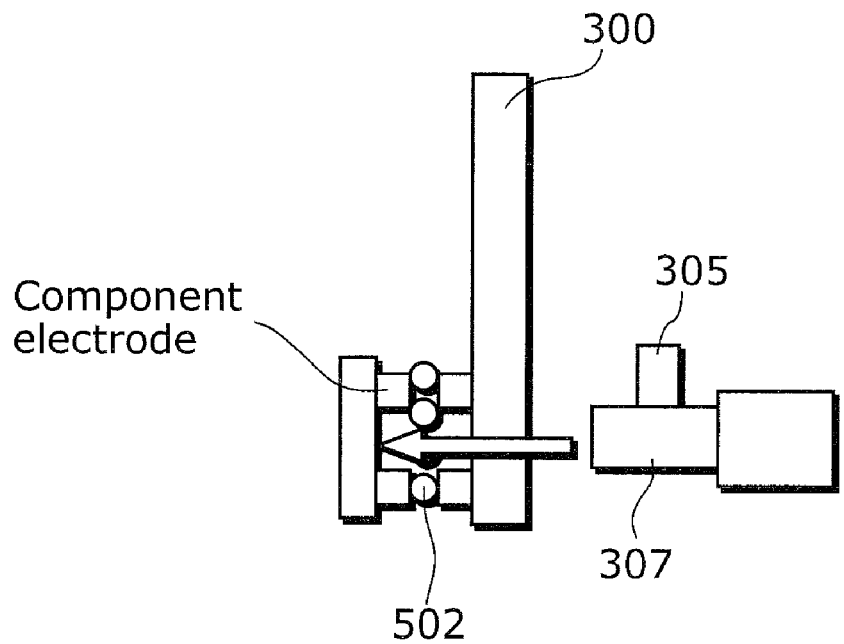
FIG. 17 shows how a position of a component recognition mark and a position of a panel recognition mark are recognized.
Figure 18:
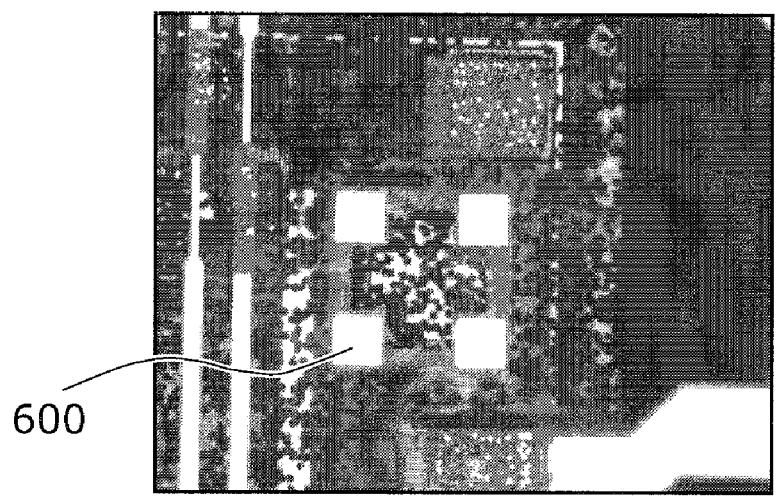
FIG. 18 shows a captured image of a panel recognition mark.

Further, as shown in FIG. 17, in the case where the mounting-completed panel 300 is inspected with only the IR camera 307 and the infrared light illuminator 305 provided on the bottom surface side of the mounting-completed panel 300, it is possible to obtain a favorable image of the panel recognition mark 600 as shown in FIG. 18. However, it is not possible to obtain a favorable image of the component recognition mark because infrared light cannot pass or does not easily pass through the conductive particles 502.

Figure 19:
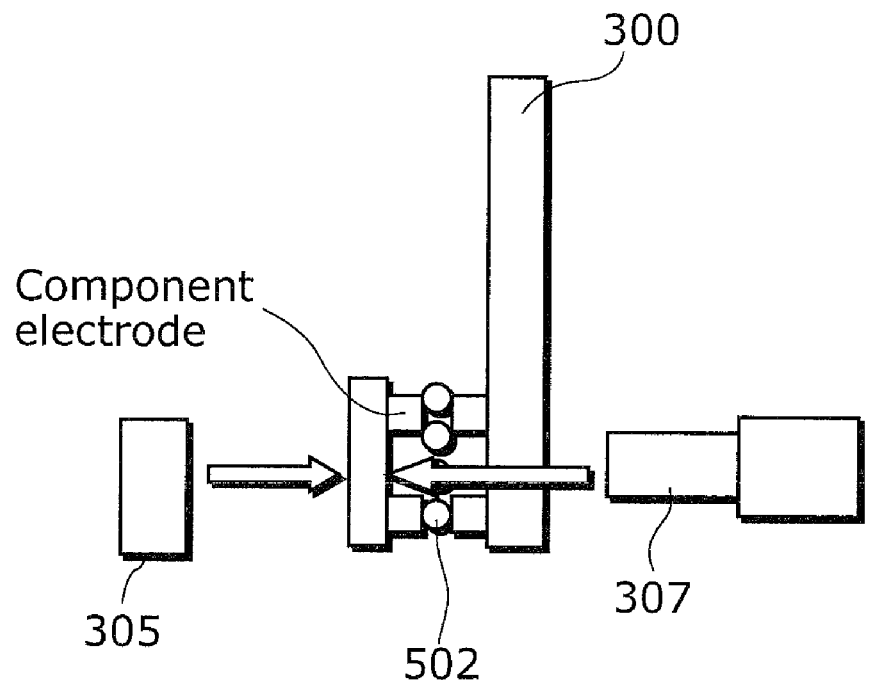
FIG. 19 shows how a position of a component recognition mark and a position of a panel recognition mark are recognized.
Figure 20:
FIG. 20 shows a captured image of a component recognition mark or a panel recognition mark.

Further, as shown in FIG. 19, in the case where the mounting-completed panel 300 is inspected with only the IR camera 307 and the infrared light illuminator 305 provided, where the infrared light illuminator 305 being placed on the side of the component's bottom surface which is opposite to the surface of the component adhered to the panel and the IR camera 307 being placed on the bottom surface side of the mounting-completed panel 300 which is opposite to the side of the mounting-completed panel 300 on which the component is mounted, it is not possible to obtain a favorable image of the panel recognition mark nor of the component recognition mark because infrared light cannot pass or does not easily pass through the conductive particles 502. For example, as shown in FIG. 20, it is only possible to obtain an image of the panel recognition mark and the component recognition mark in which the outlines of the respective recognition marks are unclear and which does not allow detection of amounts of misalignment.

Thus far, the inspection apparatus and the inspection method according to the present invention have been described above based on an embodiment, but the present invention is not limited to this embodiment. The present invention includes various modifications obvious to a person skilled in the art without departing from the scope of the present invention.

For example, the above embodiment has illustrated that the inspector is provided in the line. However, the panel mounter may have the function of inspecting the mounting-completed panel. In this case, the panel mounter has a visible light illuminator, an infrared light illuminator, a visible light camera, and an IR camera arranged in the same positional relationship as in the inspector of the above embodiment.

Further, although the above embodiment has illustrated that the component recognition mark is formed on the component's top surface that is the surface of the component adhered to the panel, the component recognition mark may be formed on the component's bottom surface that is opposite to the surface of the component adhered to the panel. In this case, in the inspector, the infrared light illuminator can be replaced with the visible light illuminator, and the IR camera can be replaced with the visible light camera.

Moreover, the above embodiment has illustrated that the inspector is provided with the infrared light illuminator and the IR camera to capture the image of the component recognition mark. However, the present invention is not limited by the above infrared light illuminator and IR camera as long as: the illuminator emits light which allows capturing of the image of the component recognition mark, that is, light having a wavelength which allows the light to pass through the component but does not allow or does not easily allow the light to pass through the conductive particles contained in the ACF; and the camera can receive such light.

Similarly, the above embodiment has illustrated that the inspector is provided with the visible light illuminator and the visible light camera to capture an image of the panel recognition mark. However, the present invention is not limited by the above visible light illuminator and visible light camera as long as: the illuminator emits light which allows capturing of the image of the panel recognition mark, that is, light having a wavelength which allows the light to pass through the panel but does not allow or does not easily allow the light to pass through the conductive particles contained in the ACF; and the camera can receive such light.

Furthermore, although the above embodiment has illustrated the use of the ACF as a material for adhering the electrode of the panel surface and the electrode of the component surface, any material may be used as long as it is an adhesive containing conductive particles.

In addition, the above embodiment has illustrated that the visible light illuminator, the infrared light illuminator, the visible light camera, and the IR camera are arranged on the same axis. However, the arrangement is not limited to this as long as: the visible light illuminator can illuminate the panel recognition mark with visible light; the infrared light illuminator can illuminate the component recognition mark with infrared light; the visible light camera can include the panel recognition mark in the field of view; and the IR camera can include the component recognition mark in the field of view.

Industrial Applicability

The present invention can be applied to inspection apparatuses and inspection methods, and particularly to component mounting systems and the like which mount components on panels.

The invention claimed is:

1. An inspection apparatus which detects an amount of misalignment of a component on a mounting-completed panel from a predetermined mounting position, the component being mounted on a top surface of a panel through an adhesive which contains conductive particles, said inspection apparatus comprising:

a visible light illuminator which is provided on a bottom surface side of the mounting-completed panel which is opposite to a side of the mounting-completed panel on which the component is mounted, and which illuminates with visible light a bottom surface of the mounting-completed panel to illuminate, from the bottom surface side of the mounting-completed panel, a panel recognition mark formed on the panel without passing the visible light through the conductive particles;

an infrared light illuminator which is provided on a side of a bottom surface of the component not adhered to the panel, and which illuminates with infrared light the bottom surface of the component to illuminate, from the side of the bottom surface of the component, a component recognition mark formed on the component without passing the infrared light through the conductive particles, the infrared light having a wavelength which does not allow or does not easily allow the infrared light to pass through the conductive particles;

a visible light camera which is provided on the bottom surface side of the mounting-completed panel which is opposite to a side of the panel on which the component is mounted, and which captures an image of the panel recognition mark illuminated with the visible light;

an infrared camera which is provided on the side of the bottom surface of the component not adhered to the panel, and which captures an image of the component recognition mark illuminated with the infrared light; and an amount-of-misalignment calculation unit configured to calculate an amount of misalignment from a predetermined positional relationship between the panel recognition mark and the component recognition mark based on the captured image of the panel recognition mark and the captured image of the component recognition mark, the panel recognition mark and the component recognition mark being arranged to overlap each other with the conductive particles therebetween, wherein an image capturing direction of said visible light camera and an image capturing direction of said infrared camera face each other on a same axis with the mounting-completed panel therebetween, wherein a direction of the visible light with which the panel recognition mark is illuminated and a direction of the infrared light with which the component recognition mark is illuminated face each other on a same axis with the conductive particles therebetween, and wherein the amount of misalignment is detected by recognition of the panel recognition mark and the component recognition mark from directions facing each other on the same axis without passing through the conductive particles, the panel recognition mark and the component recognition mark being arranged to overlap each other on the same axis with the conductive particles therebetween.

2. An inspection method for detecting an amount of misalignment of a component on a mounting-completed panel from a predetermined mounting position, the component being mounted on a top surface of a panel through an adhesive which contains conductive particles, said inspection method comprising:

illuminating with visible light a panel recognition mark formed on the panel, without passing the visible light through the conductive particles, from a bottom surface side of the mounting-completed panel which is opposite to a side of the mounting-completed panel on which the component is mounted;

illuminating with infrared light a component recognition mark formed on the component, without passing the infrared light through the conductive particles, from a side of a bottom surface of the component not adhered to the panel, the infrared light having a wavelength which does not allow or does not easily allow the infrared light to pass through the conductive particles;

capturing, using a visible light camera, an image of the panel recognition mark illuminated with the visible light in said illuminating with visible light from the bottom surface side of the mounting-completed panel which is opposite to the side of the mounting-completed panel on which the component is mounted;

capturing, using an infrared light camera, an image of the component recognition mark illuminated with the infrared light in said illuminating with infrared light from the side of the bottom surface of the component not adhered to the panel; and calculating an amount of misalignment from a predetermined positional relationship between the panel recognition mark and the component recognition mark based on the captured image of the panel recognition mark and the captured image of the component recognition mark, the panel recognition mark and the component recognition mark being arranged to overlap each other with the conductive particles therebetween, wherein an image capturing direction of the visible light camera and an image capturing direction of the infrared camera face each other on a same axis with the mounting-completed panel therebetween, wherein a direction of the visible light with which the panel recognition mark is illuminated and a direction of the infrared light with which the component recognition mark is illuminated face each other on a same axis with the conductive particles therebetween, and wherein the amount of misalignment is detected by recognition of the panel recognition mark and the component recognition mark from directions facing each other on the same axis without passing through the conductive particles, the panel recognition mark and the component recognition mark being arranged to overlap each other on the same axis with the conductive particles therebetween.

* * * * *